(12) United States Patent
Cao

(10) Patent No.: US 10,404,890 B2
(45) Date of Patent: Sep. 3, 2019

(54) MANICURE DEVICE AND MANICURE, HEALTH MANAGEMENT, AND INFORMATION PUSHING METHODS

(71) Applicant: Naicheng Cao, Beijing (CN)

(72) Inventor: Naicheng Cao, Beijing (CN)

( * ) Notice: Subject to any disclaimer, the term of this patent is extended or adjusted under 35 U.S.C. 154(b) by 50 days.

(21) Appl. No.: 15/532,479

(22) PCT Filed: Nov. 11, 2015

(86) PCT No.: PCT/CN2015/094353
§ 371 (c)(1),
(2) Date: Jun. 1, 2017

(87) PCT Pub. No.: WO2016/086761
PCT Pub. Date: Jun. 9, 2016

(65) Prior Publication Data
US 2018/0263356 A1   Sep. 20, 2018

(30) Foreign Application Priority Data

Dec. 3, 2014   (CN) .......................... 2014 1 0721844

(51) Int. Cl.
*H04N 1/387* (2006.01)
*A45D 29/00* (2006.01)
(Continued)

(52) U.S. Cl.
CPC ........... *H04N 1/3872* (2013.01); *A45D 29/00* (2013.01); *A45D 44/005* (2013.01);
(Continued)

(58) Field of Classification Search
None
See application file for complete search history.

(56) References Cited

U.S. PATENT DOCUMENTS 5,918,606 A * 7/1999 Bilotto ................... A45D 29/00
132/73
5,931,166 A * 8/1999 Weber .................... A45D 34/04
132/200
(Continued)

FOREIGN PATENT DOCUMENTS

CN    2249472 Y    3/1997
CN    1540499 A    10/2004
(Continued)

OTHER PUBLICATIONS

International Search Report (PCT/ISA/210) issued in PCT/CN2015/094353, dated Feb. 16, 2016.

*Primary Examiner* — Ted W Barnes
(74) *Attorney, Agent, or Firm* — Birch, Stewart, Kolasch & Birch, LLP

(57) ABSTRACT

A manicure device comprises at least one intelligent terminal device (1), at least one measurement and drawing device (3), and at least one server (2) deployed on the Internet. At least one manicure application module (103) is installed in the intelligent terminal device (1). The manicure application module (103) can establish a connection to the server (2). The manicure application module (103) can control the measurement and drawing device (3) to complete nail pattern drawing. The manicure application module (103) can determine the health condition of a user according to nail information of the user. The manicure application module (103) can perform big data analysis for the user and push information to the user. A manicure method, a health management method, and an information pushing method based on the manicure device.

18 Claims, 5 Drawing Sheets

(51) Int. Cl.
*G06F 17/50* (2006.01)
*A45D 44/00* (2006.01)
*G05B 19/4097* (2006.01)

(52) U.S. Cl.
CPC ......... *G05B 19/4097* (2013.01); *G06F 17/50* (2013.01); *A45D 2029/005* (2013.01); *A45D 2200/205* (2013.01); *G05B 2219/35217* (2013.01); *G05B 2219/45013* (2013.01)

(56) References Cited

U.S. PATENT DOCUMENTS

| | | | | |
|---|---|---|---|---|
| 5,988,179 | A * | 11/1999 | Jenkins | A45D 29/00 132/200 |
| 6,525,724 | B1 * | 2/2003 | Takami | A45D 29/00 345/418 |
| 7,123,983 | B2 * | 10/2006 | Yogo | A45D 31/00 700/182 |
| 2002/0156654 | A1 * | 10/2002 | Roe | G06Q 10/10 705/3 |
| 2005/0150508 | A1 | 7/2005 | Downs et al. | |
| 2009/0277470 | A1 * | 11/2009 | Mitchell | A45D 31/00 132/285 |
| 2012/0274683 | A1 * | 11/2012 | Yamasaki | B41J 3/4073 347/2 |
| 2012/0287183 | A1 * | 11/2012 | Bitoh | A45D 29/00 347/3 |
| 2013/0038648 | A1 * | 2/2013 | Kasahara | B41J 3/407 347/2 |
| 2013/0247929 | A1 * | 9/2013 | Namai | B41J 3/407 132/200 |
| 2014/0153066 | A1 * | 6/2014 | Booppanon | G03B 15/07 358/483 |
| 2015/0007841 | A1 * | 1/2015 | Yamasaki | A45D 29/00 132/73.5 |
| 2015/0201734 | A1 * | 7/2015 | Yamasaki | A45D 34/04 132/200 |
| 2016/0052295 | A1 * | 2/2016 | Legallais | B41J 29/38 358/1.8 |
| 2016/0073759 | A1 * | 3/2016 | Malafarina | A45D 29/001 132/200 |
| 2016/0088197 | A1 * | 3/2016 | Yamasaki | H04N 5/225 132/73.6 |
| 2016/0088917 | A1 * | 3/2016 | Nagao | A45D 29/00 132/200 |

FOREIGN PATENT DOCUMENTS

| | | |
|---|---|---|
| CN | 201350729 Y | 11/2009 |
| CN | 103479047 A | 1/2014 |
| CN | 103974098 A | 8/2014 |
| CN | 103976715 A | 8/2014 |
| CN | 104382327 A | 3/2015 |
| CN | 204580251 U | 8/2015 |

* cited by examiner

MANICURE DEVICE AND MANICURE, HEALTH MANAGEMENT, AND INFORMATION PUSHING METHODS

BACKGROUND

The present invention relates to a beauty device, and methods for beauty, health management and information pushing based on the beauty device, and more specifically, to a manicuring device, and methods for manicuring, health management and information pushing based on the manicuring device.

The existing digital manicuring equipment is complex equipment with a display device, a photographic device, a spray-painting device, a control device, a CPU, storage means and the like, incorporating software and hardware. A large amount of designs for nails are stored in the digital manicuring equipment. Those designs are displayed on the display device via which a user can select a design. After the user selects the design, the photographic device of the manicuring equipment takes pictures of a fingernail from various angles and then calculates a three-dimensional shape for the fingernail. Finally, the manicuring equipment spray-paints the design on the fingernail according to the three-dimensional shape.

However, the existing digital manicuring equipment is rather expensive, has a large size and is only used by professional nail salons.

SUMMARY

It is an objective of the present invention to provide a low-cost manicuring device based on the mobile internet Internet and an intelligent terminal device, and methods for manicuring, health management and information pushing using the manicuring device.

A manicuring device of the present invention comprises at least one intelligent terminal device, at least one measurement spray-painting device, and at least one server terminal arranged on the Internet. The intelligent terminal device comprises a smartphone, a tablet computer or other intelligent terminal devices. The intelligent terminal device performs information connection with the measurement spray-painting device in wireless and/or wired manner. The intelligent terminal device performs information connection and exchange with the remote server terminal on the Internet in wireless and/or wired manner. The measurement spray-painting device of the present invention comprises a painting mechanism which can paint dye on a fingernail surface. The painting mechanism comprises a painting actuator comprising a nozzle capable of spraying dye micro droplets and/or a paintbrush, and further comprises a motion mechanism driving the painting actuator to move, the motion mechanism driving the nozzle and/or the paintbrush to move and rotate within three-dimensional space so as to paint dye on the fingernail surface. The painting mechanism further comprises dye and auxiliary mechanism. The measurement spray-painting device of the present invention comprises at least one reflecting mirror assembly comprising at least one reflecting mirror and/or prism. The plurality of reflecting mirrors and/or prisms are arranged in different positions around the fingernail, with an angle of intersection between different reflecting mirrors. The plurality of reflecting mirrors can reflect images of the fingernail from multiple different angles and piece together these images of the fingernail into one picture that is further reflected to a camera of the intelligent terminal device, so that the camera of the intelligent terminal device can record multi-angle images of the fingernail in one picture. The measurement spray-painting device comprises at least one intelligent terminal device limiting mechanism on which the intelligent terminal device can be placed and fixed such that the camera is precisely in the position to accept images from the reflecting mirror. The measurement spray-painting device comprises a laser scanning mechanism comprising at least one linear and/or point laser producing device. The laser scanning mechanism further comprises at least one motion mechanism that can drive the laser producing device to move linearly and/or rotatably so that a laser spot sweeps over the user's fingernail. A laser spot image is finally projected in the camera after being reflected by the reflecting mirror assembly, and the camera shoots a laser image. With the movement of the linear laser and/or point laser, the camera records multiple laser spot pictures in succession at preset time intervals. The laser scanning mechanism comprises a grid laser producing device which can produce grid laser patterns. The shape of grids may be rectangle, triangle, hexagon, etc. When the grid laser irradiates on a plane, the laser grip pattern will not deform and keep its original shape. This original image can serve as a standard reference image. When the grid laser irradiates on the fingernail and the finger, since the fingernail is curved and height-varying, the laser grid pattern is deformed, and the deformed laser grid pattern can be captured as a measurement image. A three-dimensional shape of the fingernail can be calculated by comparing laser grips in the standard reference image and the measurement image. The measurement spray-painting device comprises at least one infrared light source for providing infrared illumination when taking pictures of the finger. Infrared rays can penetrate the fingernail to irradiate human tissues beneath the fingernail and then be transmitted, such that the camera can capture infrared pictures of human tissues for diagnosing the health condition. The measurement spray-painting device comprises at least one finger limiting mechanism capable of fixing and limiting the position of the finger for measurement and/or painting. The measurement spray-painting device comprises a control module capable of establishing data connection with the intelligent terminal device, receiving control instructions of the intelligent terminal device and controlling the operation of other modules. The control module comprises storage means for storing painting implementation schemes or may not comprise storage means. The control module comprises a painting control module capable of receiving control information issued from a spray-painting management module in manicuring APP of the intelligent terminal device and controlling the motion of the motion mechanism in the painting actuator and the operation of the nozzle and paintbrush. The measurement spray-painting device also can comprise one or more image collecting devices, these image collecting devices arranged in the measurement spray-painting device being connected to the intelligent terminal device in wired or wireless manner, the manicuring APP in the intelligent terminal device controlling the operation of these image collecting devices via the measurement management module. The image collecting devices in the measurement spray-painting device and the camera on the intelligent terminal device are all components of an image collecting apparatus. The measurement spray-painting device further comprises an ultraviolet light source, and ultraviolet irradiation can accelerate the hardening of painting materials which can only harden through ultraviolet irradiation. The "APP" in the present invention is an "application" in the intelligent terminal device. The "manicuring APP" is a "manicuring application".

The intelligent terminal device is a mobile terminal or a handheld terminal with a touch display screen, a camera, an Internet accessing module, a human-computer interaction module and a CPU. The intelligent terminal device comprises various smartphones, such as 3G or 4G cellphones carrying an Android or iOS operating system. The intelligent terminal device further comprises a tablet computer and other intelligent mobile terminal devices. In the intelligent terminal device there is installed at least one manicuring APP module, i.e., manicuring application module. The manicuring APP module comprises at least one measurement management module. The measurement management module manages the working states of the camera, controls the camera to capture images and/or laser scan images of the fingernail according to instructions and/or in a preset time sequence and transmits these images to other functional module. The manicuring APP module comprises at least one server connection module capable of managing the Internet accessing module in the intelligent mobile terminal device and communicating with the server terminal. The server connection module can cause various functional modules in the manicuring APP module to exchange information with the server terminal. The server connection module can upload images of the fingernail and/or laser spot images to the server terminal. Further, the server connection module can download multiple fingernail designs and painting implementation schemes from the server terminal. The manicuring APP module comprises at least one human-computer interaction management module capable of controlling the screen of the intelligent terminal device and a human-computer interaction device. The human-computer interaction management module includes, but not limited to, a touch display screen. The human-computer interaction management module can display on the screen at least one fingernail design obtained from a fingernail design repository at the server terminal for the user to browse and select. The human-computer interaction management module can record a fingernail design selected by the user and upload the selection result via the server connection module to the fingernail design repository at the server terminal. The human-computer interaction management module can present to the user information obtained from the server terminal such as advertisements, and record the user's interaction behavior such as browsing and clicking. The manicuring APP module comprises at least one spray-painting management module, the spray-painting management module receiving a painting implementation scheme from the server terminal and converting the same into control instructions. The control instructions include a switch command, a displacement command and a rotation command. The spray-painting management module can establish information connection with the control module of the measurement spray-painting device to transmit control instructions to the control module. The control instructions comprise the on-off of various sub-modules and sub-mechanisms in the measurement spray-painting device, displacement and rotation of the motion mechanism, whether the nozzle of the painting mechanism spray-paints or not, etc. The control module controls the on-off of devices and the motion of the motion mechanism according to these instructions. The spray-painting management module can control the operation process of the painting mechanism in the measurement spray-painting device, convert a painting implementation scheme downloaded from the server terminal into a control signal, and transmit the control signal to the measurement spray-painting device for controlling the operation of the painting mechanism such as displacement, rotation and whether to paint, thereby completing painting the fingernail. The spray-painting management module can also be arranged in the measurement spray-painting device to complete control of the painting mechanism. The measurement management module can control the laser scanning mechanism, control the on-off of a laser device and the motion of the motion mechanism, and cooperate with the camera to complete collecting laser scan images of the fingernail. Information and data connection between the intelligent terminal device and the measurement spray-painting device can be implemented wirelessly such as by Bluetooth or other wireless communication, or in wired manner. Information delivered between the control module of the measurement spray-painting device and the spray-painting management module in the manicuring APP module of the intelligent terminal device comprises a device on-off control command and a stepper motor control command.

The manicuring device of the present invention comprises at least one fingernail information collecting module comprising a camera of the intelligent terminal device, a measurement management module, and a reflecting mirror assembly of the measurement spray-painting device. The module further comprises a laser scanning mechanism of the measurement spray-painting device. During use, the intelligent terminal device is arranged on an intelligent terminal device limiting mechanism of the measurement spray-painting device, such that the camera of the intelligent terminal device is aligned with the reflecting mirror assembly. Multi-direction images of the fingernail are projected to the camera through the reflecting mirror assembly, so that the camera can obtain multi-direction, multi-perspective images of the fingernail from one picture that is shot at a time. In this way, it is avoided that pictures of the fingernail have to be shot multiple times from different angles, the speed of obtaining images of the fingernail is increased, the proportion of the fingernail in various pictures can be ensured consistent with each other, and the accuracy degree of the fingernail three-dimensional shape calculation and recognition is improved. The fingernail information collecting module further comprises a three-dimensional laser measurement system comprising a laser scanning mechanism and a reflecting mirror assembly of the measurement spray-painting device, a camera of the intelligent terminal device, and a measurement management module. The laser scanning mechanism produces a grid and/or bar and/or point laser spot. A laser spot image is refracted by the reflecting mirror assembly and then enters the camera and finally is captured by the camera. The measurement management module uploads a spot picture to a fingernail three-dimensional shape calculating module which completes precise measurements of a three-dimensional shape of the fingernail. A method for three-dimensional laser measurement is a well known technique. A known three-dimensional laser measurement device requires at least two cameras. The two cameras simultaneously capture pictures of a spot, and three-dimensional coordinates at the spot are calculated by triangulation. In the present invention, the reflecting mirror assembly comprises at least two reflecting mirrors, different reflecting mirrors are located in different positions around the fingernail and reflect images of the fingernail to the camera, and the camera can shoot laser spot images from different perspectives in one picture, which corresponds to that a three-dimensional laser measurement system has at least two cameras. The three-dimensional laser measurement system can further comprise at least one filter that allows the passage of light with wavelengths of laser in the laser scanning mechanism while blocking the passage of light with other wavelengths. As such, only laser spot images enter the camera, avoiding interference from other light and improving the accuracy degree of the fingernail three-dimensional shape recognition.

In order to conveniently locate the fingernail position and identify the position change of the fingernail in time during painting the fingernail, at least two locating points are placed in non-fingernail positions on the finger's distal joint close to the fingernail. The locating point can be a reflective thin plate affixed to the skin behind the fingernail, or dye point or a color lump spray-painted on the skin around the fingernail. The locating point may take various shapes such as a circle, a triangle, a quadrilateral, etc. The shape and/or sharp corner and/or arrangement of the locating point functions to indicate a direction and can be used for locating the finger and the fingernail's position. The locating point can be shot by the camera. The measurement management module can identify the position change of the locating point in real time and further identify the position change of the fingernail in real time. The measurement management module delivers information on the position change of the fingernail to the spray-painting management module which adjusts a spray-painting implementation scheme in real time according to the fingernail's latest position and ensures the design to be spray-painted on a correct position of the fingernail. The identifying the position of the locating point can be implemented by the fingernail three-dimensional shape calculating module. The adjusting the spray-painting implementation scheme can also be implemented by a spray-painting implementation scheme generating module.

The server terminal comprises at least one fingernail design repository comprising a database for storing fingernail designs, transmitting fingernail designs to the intelligent terminal device and accepting information on a fingernail design selected by the user. The fingernail design repository comprises at least one free repository for managing, storing and releasing free fingernail designs. The fingernail design repository comprises at least one charging repository for managing and storing charging fingernail designs. The fingernail design repository comprises at least one user uploaded repository for managing and storing fingernail designs uploaded by users via the manicuring APP module. Fingernail designs include, but not limited to, pictures, painting rendering, images, and designs which can be painted on fingernails. The fingernail design repository can be partially and/or entirely arranged in the intelligent terminal device. The server terminal comprises at least one fingernail three-dimensional shape calculating module which can receive a fingernail image and/or laser image transmitted from the measurement management module in the manicuring APP module of the intelligent terminal device, recognize a position of the fingernail from the image and measure the fingernail's three-dimensional shape. The fingernail three-dimensional shape calculating module can also be arranged in the manicuring APP module of the intelligent terminal device. The server terminal comprises at least one painting implementation scheme generating module which can calculate a painting implementation scheme according to a design selected by the user and the fingernail's three-dimensional shape. The painting implementation scheme includes, but not limited to, color selection of the nozzle and/or paintbrush of the painting actuator of the measurement spray-painting device, a movement trajectory, an angle of rotation, whether to paint or not, rise or fall, and control information of the motion mechanism. The painting implementation scheme generating module can also be arranged in the manicuring APP module of the intelligent terminal device. The server terminal comprises at least one health management module which can recognize user's fingernail information according to an uploaded user's fingernail image so as to estimate the health condition of the user. The user's fingernail information includes, but not limited to, color, shape, texture, quality, blood flow under the fingernail, etc. The blood flow under the fingernail can be obtained according to infrared image information contained in the fingernail picture. The health management module can be entirely and/or partially arranged in the manicuring APP module of the intelligent terminal device. The server terminal comprises at least one user management module comprising at least one user database for recording user information. The user management module can record personal information of the user. The personal information includes, but not limited to, age, health condition, cellphone number, location for going online, online behavior, browsing and clicking behavior, etc. The user management module comprises at least one user analysis module for analyzing the personal information of the user by using the big data technique, so as to obtain the user's personal preference, consumption capacity and buying demand. The user management module comprises at least one information pushing module which can precisely push various information to the user according to an analysis result of the user personal information, the various information including but not limited to advertisements and various news and messages. The human-machine interaction management module of the manicuring APP module of the intelligent terminal device can record behavioral data such as browsing, clicking and so on when the user is browsing information delivered by the information pushing module, and deliver these data to the user analysis module of the user management module at the server terminal so as to analyze the user's preference for pushed information by big data technology and adjust content of to-be-pushed information in real time.

There is provided a manicuring method based on the manicuring device of the present invention. A user initiates a manicuring APP module in an intelligent terminal device, a server connection module in the APP is connected to a server terminal, and the user can log onto a user management module at the server terminal via the server connection module. A human-computer interaction management module of the intelligent terminal device downloads fingernail designs in a fingernail design repository at the server terminal and displays them on a screen of the intelligent terminal device. The user browses fingernail designs and selects one or more designs, the human-computer interaction management module uploads the selection result of the user to the fingernail design repository at the server terminal, and the fingernail design repository delivers the design selected by the user to a painting implementation scheme generating module. The manicuring APP module sends a prompt to the user in the form of graphics or text on the screen of the intelligent terminal device, or in the form of sound, reminding the user to establish a connection between the intelligent terminal device and a measurement spray-painting device. Then the user establishes information and control connection between the measurement spray-painting device and the intelligent terminal device. The manicuring APP module prompts the user to place the intelligent terminal device in an intelligent terminal device limiting mechanism of the measurement spray-painting device. After the user places the intelligent terminal device in the limiting mechanism, the user clicks on an "OK" or "Next" button to move on to the next step. The manicuring APP module prompts the user to place the finger in a finger limiting mechanism of the measurement spray-painting device. After the user places the finger in the limiting mechanism, the user clicks on a "Next" or "Start to measure" button, thereby starting the step of measuring a three-dimensional shape of the fingernail. The measuring the three-dimensional shape of the fingernail can be implemented by two methods separately or jointly. One measurement method is to measure a fingernail shape by image recognition. A reflecting mirror assembly in the measurement spray-painting device reflects multiple fingernail images shot from different angles and in different positions to a camera of the intelligent terminal device. After the user clicks on the "Start to measure" button, a measurement management module controls the camera to shoot one picture that includes multi-angle multi-direction images of the fingernail. The server connection module uploads the picture of the fingernail to a fingernail three-dimensional shape calculating module at the server terminal, and then the fingernail three-dimensional shape calculating module completes recognizing the fingernail in the picture and calculating the fingernail's three-dimensional shape. Image recognition is a well known technique. The other measurement method is to measure a fingernail shape by laser three-dimensional measurement that is a well known technique. A laser three-dimensional measurement system of the manicuring device of the present invention comprises a laser scanning mechanism, a reflecting mirror assembly, a camera, a measurement management module, and a fingernail three-dimensional shape calculating module. The laser three-dimensional measurement system further comprises a filter. The laser scanning mechanism can send a grid spot which irradiates on the fingernail. Since the fingernail is subjected to three-dimensional shape variation, the grid spot deforms; the camera captures a deformed grid spot pattern, compares it with an undeformed grid spot pattern, and obtains a three-dimensional shape of the fingernail by tri-angulation. The laser scanning mechanism can further send a linear and/or point spot. Driven by a motion mechanism, the spot of the laser scanning mechanism sweeps over the entire fingernail. The camera captures spot pictures in the scanning process at set intervals and uploads them to the fingernail three-dimensional shape calculating module. The fingernail three-dimensional shape calculating module calculates a fingernail shape at the spot in each picture, and pieces fingernail shapes at different spots in multiple pictures together into a complete fingernail shape. In the measurement process, the position of a spot of the laser scanning mechanism corresponding to each picture needs to be recorded, which position can be derived from the position of the motion mechanism. Further a laser beam can be reflected by a rotary reflecting mirror. The laser beam irradiates the fingernail after being reflected by the reflecting mirror, and by rotating the reflecting mirror, the spot sweeps over the entire fingernail. By recording laser spot pictures when the reflecting mirror is at different angles, a three-dimensional shape of the entire fingernail is obtained. In the step of measuring the three-dimensional shape of the fingernail, the fingernail three-dimensional calculating module calculates multi-angle pictures of the fingernail and/or laser scan spot pictures to complete calculating the three-dimensional shape of the fingernail, thereby obtaining a digital model of the three-dimensional shape of the fingernail. The fingernail three-dimensional shape calculating model delivers the fingernail three-dimensional shape digital model to the painting implementation scheme generating module which then generates a painting implementation scheme according to the fingernail three-dimensional shape digital model and the design selected by the user. The fingernail design is two-dimensional, whereas the fingernail is three-dimensional and has spatial shape variation. The painting implementation scheme generating module maps the two-dimensional plane design to the three-dimensional fingernail surface and then obtains a spatial three-dimensional position of each pixel of the mapped design. According to the three-dimensional spatial position of the pixel, a spatial position where the painting actuator (for example, the nozzle or paintbrush tip) is supposed to be when painting different pixels can be calculated. The painting implementation scheme comprises three-dimensional positions of the painting actuator at all pixels. Further the painting implementation scheme comprises colors of each pixel to be painted in, and a motion control trajectory of the painting actuator. The painting actuator further comprises a paintbrush, and the painting implementation scheme further comprises operation control information such as selection and change of a paintbrush model, selection of a paintbrush color, a tip motion trajectory, etc. The painting implementation scheme determines a color each point on the fingernail needs to be patented in, according to the design's three-dimensional mapping on the fingernail. The painting implementation scheme further comprises a precedence order between different colors, and a coverage relationship between multiple layers of overlapping colors. During manicuring, part of coating materials need to be irradiated, dried and hardened by ultraviolet rays or infrared rays, have to wait for some time for dye to dry. The painting implementation scheme comprises times of and an order between operations such as pigment drying and chemical changes. The server terminal transmits the calculated painting implementation scheme to a spray-painting management module in the manicuring APP module of the intelligent terminal device. The spray-painting management module converts the painting implementation scheme into an electrical signal which is then delivered to a control module of the measurement spray-painting device via wired or wireless connection. The control module controls the operation of various relays, on and off of switches, initiation and stop of the stepper motor according to the electrical signal. Under the control of the control module, the nozzle and/or paintbrush of the painting actuator moves under the drive of the motion mechanism, and spray-paints a pigment corresponding to the painting implementation scheme on each point on the fingernail, thereby completing spray-painting the fingernail design.

The process of spray-painting the fingernail design can be adjusted in real time. After the server terminal calculates the fingernail spray-painting implementation scheme, the fingernail information collecting module collects position information of the fingernail so as to prevent the finger position from moving. The fingernail information collecting module uploads the fingernail design to the server terminal, and the fingernail three-dimensional shape calculating module at the server terminal identifies the fingernail position in real time and compares it with an initial fingernail position so as to determine whether there is a displacement or not. If yes, the painting implementation scheme generating module adjusts the painting implementation scheme according to position change and immediately downloads the adjusted painting implementation scheme to the spray-painting management module of the intelligent terminal device, and the spray-painting management module adjusts the position of the painting actuator in real time so as to paint the fingernail more accurately. During painting, the fingernail information collecting module can collect position information of the fingernail in real time and upload the same to the fingernail three-dimensional shape calculating module in real time. The fingernail three-dimensional shape calculating module can identify a position of the fingernail in real time. The painting implementation scheme generating module can adjust the painting implementation scheme in real time according to position change of the fingernail and download in real time the painting implementation scheme to the spray-painting management module so as to adjust in real time the spray-painting process of the painting actuator of the measurement spray-painting device. During spray-painting, the fingernail information collecting module can collect in real time the enforcement condition of the fingernail design being painted, and upload the design to the server terminal in real time. The fingernail three-dimensional shape calculating module at the server terminal can identify in real time the enforcement condition of the design, and estimate whether the fingernail is displaced according to two consecutive painting designs of the fingernail. If the fingernail is displaced, the painting implementation scheme generating module adjusts in real time the spray-painting implementation scheme according to the position change of the fingernail and the enforcement condition of the design, and downloads in real time the adjusted painting implementation scheme to the spray-painting management module of the intelligent terminal device so as to adjust the spray-painting process in real time.

In order to estimate position change of the fingernail in the painting process more accurately, when generating a painting implementation scheme, the server terminal can select at least two locating points from a design according to features of the design. The locating point may be a point in the design which contrasts dramatically with surrounding pixel colors, or may be a point with striking features and being easy to recognize, such as an intersection, vertex and corner of lines or color lumps in the design. When starting to paint the fingernail, the painting implementation scheme generating module downloads information of the locating point to the spray-painting management module which controls the painting actuator to paint the locating point on the fingernail. If the fingernail is displaced, the painting implementation scheme generating module calculates a painting position of the displaced locating point on the fingernail and downloads the locating point painting information to the spray-painting management module which controls the painting actuator to paint the locating point on the fingernail. During spray-painting, the fingernail information collecting module uploads pictures of the locating points to the server terminal in real time. The fingernail three-dimensional shape calculating module at the server terminal identifies the locating point in real time and monitors whether the locating point position changes or not. If yes, then the fingernail is displaced. The painting implementation scheme generating module can adjust the spray-painting implementation scheme in real time according to the position change of the fingernail, and download in real time the adjusted painting implementation scheme to the spray-painting management module of the intelligent terminal device. The spray-painting management module adjusts the spray-painting process of the painting actuator of the measurement spray-painting device.

The health condition of a person can be estimated by observing a fingernail's shape, size, color, texture and so on. Infrared rays can penetrate the skin and fingernails on the surface of a human body and irradiate capillaries and blood flow under the fingernails. There is provided a method for health diagnosis in a manicure based on the manicuring device of the present invention. After the user initiates the manicuring application on the intelligent terminal device, during manicuring, an infrared light source in the measurement spray-painting device of the manicuring device irradiates the fingernail of the user, the fingernail information collecting module shoots fingernail images under the infrared irradiation and uploads them to the health management module at the server terminal. The health management module at the server terminal queries a health expert system according to fingernail images, estimates health condition of the user and delivers a result to the human-computer interaction management module of the intelligent terminal device which then presents the result to the user in the form of text, sound, graphics and the like. There is further provided a method for health diagnosis in a manicure based on the manicuring device of the present invention. After the user initiates the manicuring application on the intelligent terminal device, during manicuring, the fingernail information collecting module of the manicuring device shoots fingernail images and uploads them to the fingernail three-dimensional shape calculating module and the health management module at the server terminal. The fingernail three-dimensional shape calculating module calculates a three-dimensional shape of the fingernail and delivers the same to the health management module. The health management module queries a health expert system according to the fingernail's three-dimensional shape, surface texture, color, presence or absence of a lunula, the number of lunulae and other information, estimates the health condition of the user according to features of the fingernail and delivers a result to the human-computer interaction management module of the intelligent terminal device which then presents the result to the user in the form of text, sound, graphics and the like.

There is provided a method for pushing information to a user in a manicure based on the manicuring device of the present invention. After the user initiates the manicuring application on the intelligent terminal device, the user logs onto the user management module at the server terminal and starts the manicuring process. During manicuring, the user management module at the server terminal performs big data analysis on the user's personal information, browsing behavior and the like so as to estimate the user's preference and demand. The information pushing module pushes various promotion information to the user's intelligent terminal device according to the user's preference and demand, the promotion information including but not limited to various advertisements. The timing for pushing information includes a time when the user is measuring the fingernail shape, a time when the user is selecting a manicure design, and a time when the fingernail design is being painted. The form in which information is pushed includes sound, picture, image, animation multimedia, etc. The picture may be displayed on the whole screen of the intelligent terminal device or on the lower part or both sides of the manicuring application interface.

The manicuring device of the present invention comprises at least one intelligent terminal device, at least one measurement spray-painting device and at least one server terminal.

The intelligent terminal device is connected with the measurement spray-painting device, and the intelligent terminal device comprises at least one manicuring application module, the manicuring application module comprises at least one measurement management module, the measurement management module controls a camera in the intelligent terminal device and/or in the measurement spray-painting device to complete a visible light and/or infrared and/or laser shoot of a fingernail. The manicuring application comprises at least one spray-painting management module capable of controlling the measurement spray-painting device to complete spray-painting a manicure design on the fingernail. The intelligent terminal device can be connected with the server terminal. A measurement management module of the intelligent terminal device of the manicuring device of the present invention can control a laser scanning mechanism in the measurement spray-painting device to complete three-dimensional laser scanning of a shape of the fingernail. The manicuring device of the present invention comprises at least one fingernail information collecting module, the fingernail information collecting module comprises a camera in an intelligent terminal device and/or a camera in a measurement spray-painting device, a measurement management module of a manicuring application module in the intelligent terminal device, and a reflecting mirror assembly in the measurement spray-painting device. The fingernail information collecting module can further comprise a laser scanning mechanism. The manicuring device of the present invention comprises at least one server terminal connected with an intelligent terminal device on which a manicuring application is installed. The server terminal comprises at least one manicure design repository comprising a plurality of manicure designs, the manicure design repository delivering the manicure design to the manicuring application module of the intelligent terminal device. The manicure design repository comprises at least one charging repository comprising a plurality of manicure designs which can be used after payment. The manicure design repository comprises at least one user uploaded repository comprising a plurality of manicure designs uploaded by the user via the manicuring application module. The user uploaded repository is used for managing manicure designs uploaded by the user. The manicuring device of the present invention comprises at least one server terminal connected with an intelligent terminal device on which a manicuring application is installed, the server terminal comprising at least one health management module, wherein the health management module can receive a visible light and/or infrared image of the user's fingernail uploaded by the intelligent terminal device and/or three-dimensional shape information of the user's fingernail delivered by a fingernail three-dimensional shape calculating module, and wherein the health management module can estimate health condition of the user according to the visible light and/or infrared image and/or the three-dimensional shape information of the user's fingernail. The manicuring device of the present invention comprises at least one server terminal connected with an intelligent terminal device on which a manicuring application is installed, the server terminal comprising at least one user management module, wherein the user management module can perform big data analysis of the user according to the user's personal features and/or health condition and/or features of using the manicuring application and/or response to pushed information, so as to estimate the user's personal preference and/or consumer demand. The user management module comprises at least one information pushing module capable of pushing promotion information regarding the user's personal preference and/or consumer demand to the manicuring application of the intelligent terminal device according to the user's personal preference and/or consumer demand. The manicuring device of the present invention comprises at least one measurement spray-painting device comprising at least one reflecting mirror assembly, the reflecting mirror assembly comprising at least two reflecting mirrors arranged in different positions around the fingernail, wherein the reflecting mirror can reflect images of the fingernail from different perspectives to the camera of the intelligent terminal device and/or of the measurement spray-painting device so as to capture these images of the fingernail from different perspectives in one picture. The manicuring device of the present invention comprises at least one measurement spray-painting device comprising at least one laser scanning mechanism, wherein the laser scanning mechanism can perform laser scanning to the fingernail so as to carry out three-dimensional laser measurement of the fingernail for obtaining a three-dimensional shape of the fingernail. The manicuring device of the present invention comprises at least one measurement spray-painting device comprising at least one infrared light source.

A manicuring method based on the manicuring device of the present invention comprises the steps of:

a. connecting an intelligent terminal device with a measurement spray-painting device;

b. initiating a manicuring application module in the intelligent terminal device, establishing a connection between the manicuring application module and a server terminal;

c. a user browsing manicure designs in a fingernail design repository at the server terminal via a human-computer interaction management module of the manicuring application module and selecting a manicure design, the selected manicure design being delivered to a painting implementation scheme generating module;

d. the user putting a finger into the measurement spray-painting device and the manicuring application module controlling a fingernail information collecting module to complete collecting fingernail information;

e. the manicuring application module delivering the collected fingernail information of the user to a fingernail three-dimensional shape calculating module;

f. the fingernail three-dimensional shape calculating module calculating a three-dimensional shape of the user's fingernail and delivering the three-dimensional shape information of the fingernail to the painting implementation scheme generating module;

g. the painting implementation scheme generating module calculating a painting implementation scheme according to the three-dimensional shape of the user's fingernail and the manicure design selected by the user, and delivering the painting implementation scheme to a spray-painting management module in the manicuring application module in the intelligent terminal device; and h. the spray-painting management module controlling the measurement spray-painting device to complete painting the fingernail design, wherein the step a may be executed after the step b or c; and wherein the order between the step c and the steps d, e, f can be interchanged.

A manicuring method based on the manicuring device of the present invention comprises the steps of:

a. arranging at least two locating points on the skin around a fingernail;

b. measuring initial positions of the locating points while measuring a three-dimensional shape of the fingernail;

c. measuring in real time the change of positions of the locating points relative to the initial positions during spray-painting so as to estimate whether a position of the fingernail changes or not; and d. if the position of the fingernail changes, adjusting a spray-painting implementation scheme in real time according to the change of the position of the fingernail.

In the step a, the locating point can be a locating plate affixed to the skin behind the fingernail or dye point spray-painted on the skin around the fingernail. In case of an adhesive locating plate, then the locating plate may be affixed to the skin before the user puts the finger into the measurement spray-painting device. In case of a spray-painted dye point, then the locating point may be spray-painted on the skin behind the fingernail before starting to measure the three-dimensional shape of the fingernail. As such, the locating point is also shot while shooting images of the fingernail. After images are transmitted to the fingernail three-dimensional shape calculating module, this module can identify these locating points and calculate a positional relationship between the locating points and the fingernail. Since the skin behind the fingernail and the position of the fingernail are fixed, the positional relationship between the fingernail and the locating points is also fixed. The skin behind the fingernail is the skin where a finger joint to which the fingernail belongs is close to the fingernail. If the position of the locating point changes, then the position of the fingernail also changes, and the position change of the fingernail can be calculated according to the position change of the locating point. In this way, the position of the fingernail can be determined according to the locating point. Since identifying the locating point is much easier than identifying the fingernail, the efficiency of identifying the position change of the fingernail in real time can be improved, and the precision degree of painting implementation increased.

A health management method based on the manicuring device of the present invention comprises the steps of:
a. connecting an intelligent terminal device with a measurement spray-painting device;
b. initiating a manicuring application module in the intelligent terminal device, the manicuring application module establishing a connection with a server terminal;
c. a user putting a finger into the measurement spray-painting device and the manicuring application module controlling a fingernail information collecting module to complete collecting fingernail information;
d. the manicuring application module delivering the collected fingernail and image information of the user to a fingernail three-dimensional shape calculating module and/or a health management module;
e. the fingernail three-dimensional shape calculating module calculating a three-dimensional shape of the user's fingernail and delivering the three-dimensional shape information of the fingernail to the health management module;
f. the health management module estimating the health condition of the user according to the image information and/or the three-dimensional shape information of the user's fingernail;
g. the health management module delivering health information of the user to a user management module for big data analysis of the user; and
h. the health management module delivering the health information of the user to the intelligent terminal device and presenting the same to the user, wherein the order between the steps a and b can interchange; and wherein the step e can be removed; and wherein the step g can be removed.

An information pushing method based on the manicuring device of the present invention comprises the steps of:
a. initiating a manicuring application module in an intelligent terminal device, the manicuring application module establishing a connection with a server terminal;
b. a user logging onto a user management module at the server terminal;
c. the user management module performing big data analysis on the user according to the user's personal features and/or health condition and/or features of using the manicuring application and/or response to pushed information, so as to estimate the user's personal preference and/or consumer demand of the user; and
d. an information pushing module pushing promotion information concerning the user's personal preference and/or consumer demand to the manicuring application of the intelligent terminal device according to the user's personal preference and/or consumer demand, wherein the step b can be removed; and wherein the step c can be removed.

With the manicuring device of the present invention, the cost of manicuring equipment can be reduced, and it is easy to popularize manicuring equipment.

With the manicuring method of the present invention, a manicure can be performed conveniently and can be realized freely at home.

The health management method based on the manicuring device of the present invention can be implemented conveniently based on the manicuring device. And functions of the manicuring device are expanded without any hardware cost added.

The information pushing method based on the manicuring device of the present invention can conveniently push information based on the manicuring device, and functions of the manicuring device are expanded without any hardware cost added.

DETAILED DESCRIPTION

Figure 1:
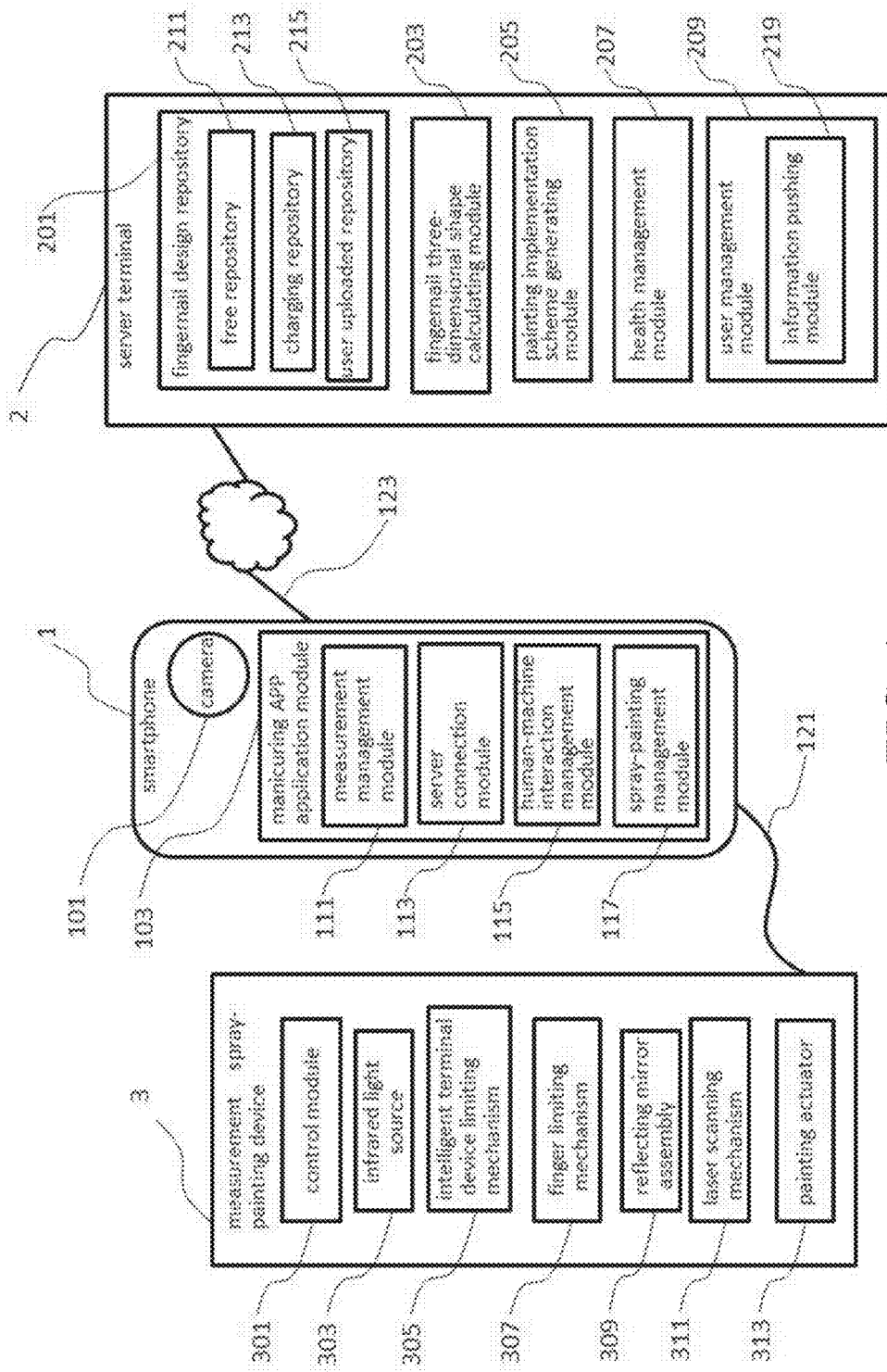
FIG. 1 shows a schematic view of the constitution of a manicuring device according to an embodiment of the present invention.

A manicuring device in FIG. 1 comprises a smartphone 1, a server terminal 2, and a measurement spray-painting device 3. The smartphone 1 performs information connection with the measurement spray-painting device 3 via a USB interface data cable 121. The smartphone 1 performs information connection and exchange with the remote server terminal 2 on the Internet in wireless mode 123. The measurement spray-painting device 3 comprises a painting mechanism which can apply dye to the surface of a fingernail. The painting mechanism comprises a painting actuator 313 which comprises a nozzle capable of spraying dye micro-droplets and/or a paintbrush. The painting mechanism comprises an auxiliary mechanism and a stepper motor driving the painting actuator 313 to move, the stepper motor driving the nozzle and/or paintbrush to move within three-dimensional space so as to apply dye to the surface of fingernails. A control module 301 may or may not comprise storage means for storing painting implementation schemes. The measurement spray-painting device 3 comprises at least one reflecting mirror assembly 309 which comprises at least one reflecting mirror and/or prism. Multiple reflecting mirrors and/or prisms are arranged in different positions around the fingernail, with angles of intersections between different reflecting mirrors. The multiple reflecting mirrors can reflect fingernail images from multiple different angles and simultaneously reflect the same to a camera 101 of the smartphone 1, so that the camera 101 of the smartphone 1 can record multi-angle images of the fingernail in one image, i.e., one picture. The measurement spray-painting device 3 comprises at least one intelligent terminal device limiting mechanism 305 on which the smartphone 1 can be provided and fixed so that the camera 101 is rightly in the position to receive images reflected from the reflecting mirror assembly 309. The measurement spray-painting device 3 comprises a laser scanning mechanism 311 which comprises at least one linear laser light source. The laser scanning mechanism 311 comprises at least one motion mechanism which can drive the laser light source to move linearly and/or rotatably so that the linear laser can scan a user's fingernail. A laser spot image is projected in the camera 101 through the reflecting mirror assembly 309, and then the camera 101 shoots a laser image. The laser light source moves constantly under the drive of the motion mechanism, and the laser spot sweeps over the whole fingernail surface. With the movement of the linear laser spot, the camera 101 continuously records multiple laser spot pictures at preset time intervals and uploads them to a fingernail three-dimensional shape calculating module 203 at the server terminal 2. The laser scanning mechanism 311 can further comprise a grid laser producing device which can produce grid laser patterns. Grid shapes can be rectangles, triangles, hexagons, etc., with a size between 0.1 mm and 19 mm. When the grid laser irradiates the plane, the laser grid pattern will not deform but keeps its original shape. The original image can serve as a standard reference image. When the grid laser irradiates the fingernail and the finger, since the fingernail is curved and height-varying, the laser grid pattern is deformed, and the deformed laser grid pattern can be captured by the camera 101 and uploaded to the fingernail three-dimensional shape calculating module 203. The fingernail three-dimensional shape calculating module 203 compares the deformed laser grip pattern with the standard reference image, thereby obtaining the fingernail's three-dimensional shape and dimension. The measurement spray-painting device 3 comprises at least one infrared light source 303 for providing infrared illumination when taking pictures of fingers. Infrared rays can penetrate the fingernail and skin to irradiate capillaries under the fingernail and skin; since usually cameras can capture infrared rays, the camera 101 can capture infrared images of capillaries. The infrared image of capillaries is uploaded to a health management module 207 at the server terminal 2. In addition, the fingernail's three-dimensional shape measured by the fingernail three-dimensional shape calculating module together with the fingernail's color image are transmitted to the health management module. Then, the health management module estimates the user's health condition according to the fingernail's color, presence or absence of a lunula, fingernail surface texture, three-dimensional shape, blood flow of capillaries under the fingernail and so on, and presents the health condition to the user in the form of text, image or sound via a screen or loudspeaker of the smartphone 1. The measurement spray-painting device 3 comprises at least one finger limiting mechanism 307 which can fix and limit the finger's position for measurement and/or design painting. The measurement spray-painting device 3 comprises a control module 301 which can establish a data connection with the smartphone 1 for receiving control instructions from a manicuring APP application module 103 in the smartphone to control operation of other modules in the measurement spray-painting device 3. The control module 301 can receive control instructions from a measurement management module 111 and a spray-painting management module 117. The measurement management module 111 can control the infrared light source 303 and the laser scanning mechanism 311 to switch on and off via the control module 301. The control module 301 comprises a painting control module which can receive control information issued from the spray-painting management module 117 in the manicuring APP module 103 of the smartphone 1, and control the movement of the stepper motor of the painting mechanism and the operation of the nozzle and paintbrush of the painting actuator 313. Further, the measurement spray-painting device 3 can comprise one or more image collecting devices, such as cameras and still cameras. These image collecting devices arranged in the measurement spray-painting device 3 are connected via the control module 301 to the measurement management module 111 of the smartphone 1, and the manicuring APP module 103 in the smartphone controls the operation of these image collecting devices via the measurement management module 111. The image collecting devices in the measurement spray-painting device 3 and the camera on the smartphone 1 are components of an image collecting apparatus. The smartphone 1 comprises a manicuring APP module 103 which comprises at least one measurement management module 111. The measurement management module 111 manages the operation state of the camera 101 of the smartphone 1, and controls the camera 101 to take images and/or laser scanned images of the fingernail according to instructions and/or preset time sequence and transmit these images to other functional modules. The measurement management module 111 can control the scanning process of the laser scanning mechanism, control the motion of the motion mechanism of the laser scanning mechanism, control the laser light source to switch on and off, and control the infrared light source to switch on and off. The manicuring APP module 103 comprises at least one server connection module 113 which can manage an Internet accessing module and functions of the smartphone 1 so that the smartphone establishes a communication connection with the server terminal 2. The server connection module 113 can upload information to and download information from the server terminal 2, the information including but not limited to the fingernail's visible light image, infrared image and laser spot image, user selection, fingernail designs, painting implementation schemes, etc. The manicuring APP module 103 comprises at least one human-machine interaction management module 115 which can control the touch screen of the smartphone. The human-machine interaction management module 115 can display on the screen at least one fingernail design, downloaded from a fingernail design repository 201 at the server terminal 2, for the user to browse and select. The human-computer interaction management module 115 can record a fingernail design selected by the user and upload the selected result to the server terminal 2 via the server connection module 113. The human-computer interaction management module 115 can present to the user advertisements obtained from the server terminal, prompt information such as picture voice, record the user's interaction behaviors such as browsing and clicking and upload these behavioral big data to a user management module 209 at the server terminal 2. The user management module 209 can perform big data analysis for the user, estimate the user's characteristics, behavior habits, preference and other information according to the user's big data analysis result, and further push advertisements to the user based on these information. The manicuring APP module 103 comprises at least one spray-painting management module 117 which receives a painting implementation scheme from a painting implementation scheme generating module 205 of the server terminal 2 and converts the painting implementation scheme into control instructions. The spray-painting management module 117 receives a control command from the server terminal 2 and converts the control command into control instructions. The spray-painting management module 117 has a variety of manicuring flows and control schemes of the manicuring device stored therein, and can convert these flows and control schemes into control instructions including but not limited to, a switch command and a displacement command. The spray-painting management module 117 of the manicuring APP module 103 can establish an information connection with the control module 301 of the measurement spray-painting device 3 and transmit control instructions to the control module. The control instructions include, but not limited to, switch on and off of various sub-modules and sub-mechanisms in the measurement spray-painting device 3, displacement of the stepper motor, whether to spray-paint or not and displacement of the nozzle of the painting actuator, switch on and off the infrared light source, switch on and off the laser scanning mechanism, manicuring flows, working time sequence of various sub-means and sub-mechanisms, etc. The spray-painting management module 117 can control the operation process of the painting actuator 313 via the control module 301. The spray-painting management module 117 converts a painting implementation scheme, downloaded from the server terminal, into control instructions which are then transmitted to the control module 301 so as to control the displacement, rotation, whether to paint or not and other operation of the painting actuator 313 and thereby complete painting the fingernail. The spray-painting management module 111 completes collecting laser scanned images of the fingernail. The information and data connections between the smartphone 1 and the measurement spray-painting device 3 can be implemented in Bluetooth communication manner or by a USB data cable. Information delivered between the spray-painting management module 117 in the manicuring APP module 103 of the smartphone 1 and the control module 301 of the measurement spray-painting device 3 includes, but not limited to, a device switch control command and a stepper motor control command. The present embodiment comprises a fingernail information collecting module comprising the camera 101 of the smartphone 1, the measurement management module 111, and the reflecting mirror assembly 309 of the measurement spray-painting device 3. The fingernail information module further comprises the laser scanning mechanism 311 of the measurement spray-painting device 3. The server terminal 2 comprises at least one fingernail design repository 201 comprises a database for storing a plurality of fingernail designs. The fingernail design repository 201 comprises at least one free repository 211 for managing, storing and releasing free fingernail designs. The fingernail design repository comprises at least one charging repository 213 for managing and storing charging fingernail designs. The fingernail design repository comprises at least one user uploaded repository 215 for managing and storing fingernail designs uploaded by users. The free repository 211, the charging repository 213 and the user uploaded repository 215 can deliver data among them. Fingernail designs include, but not limited to, pictures, painting rendering, images, and designs which can be painted on fingernails. The fingernail design repository can be partially and/or entirely arranged in the smartphone. The server terminal 2 comprises at least one fingernail three-dimensional shape calculating module 203 which can receive a fingernail image and/or laser image transmitted from the smartphone 1, recognize a fingernail in the image and measure the fingernail's three-dimensional shape. Calculating the fingernail's three-dimensional shape according to image recognition is a well known technique. The fingernail three-dimensional shape calculating module can also be arranged in the manicuring APP module of the smartphone. The server terminal 2 comprises at least one painting implementation scheme generating module 205 which can calculate a manicure painting implementation scheme according to a design selected by the user, the fingernail's three-dimensional shape and the fingernail position. The painting implementation scheme includes, but not limited to, a movement trajectory of the nozzle and/or paintbrush of the painting actuator 313 of the measurement spray-painting device 3, whether to paint or not, and control information of the stepper motor. The painting implementation scheme generating module can also be arranged in the manicuring APP module of the smartphone. The fingernail design repository can be entirely or partially arranged in the smartphone. The server terminal 2 comprises at least one health management module 207 which can recognize user's fingernail information according to a user's fingernail image uploaded to the server terminal 2 and further estimate the health condition of the user. The user's fingernail information includes, but not limited to, color, shape, quality, texture, blood flow under the fingernail, etc. The blood flow under the fingernail can be obtained according to infrared image information contained in the fingernail picture. The method for estimating health according to fingernails is also a well known technique. The health management module can be entirely and/or partially arranged in the manicuring APP module of the smartphone. The server terminal 2 comprises at least one user management module 209 comprising at least one user database for recording user information. The smartphone 1 will upload user personal information to the user management module 209 of the server terminal 2 when user login and using the manicuring APP. The user management module 209 can record and analyze user personal information by using big data technology. The personal information includes, but not limited to, age, health condition, cellphone number, location for going online, online behavior, browsing and clicking behavior, etc. The user management module 209 comprises at least one user analysis module for analyzing personal preference, consumption capacity and buying demand of a user according to the user's personal information. The user management module comprises at least one information pushing module 219 which can precisely push various information to the user according to the user's analysis result, the information including but not limited to advertisements and various news and messages. The human-machine interaction management module 115 of the smartphone 1 can record behavioral data such as browsing, clicking and so on when the user is browsing information delivered by the information pushing module 219, and deliver these data to the user analysis module for analyzing the degree of the user's preference for pushed information by big data analysis technology and adjusting to-be-pushed information content in real time.

Figure 2:
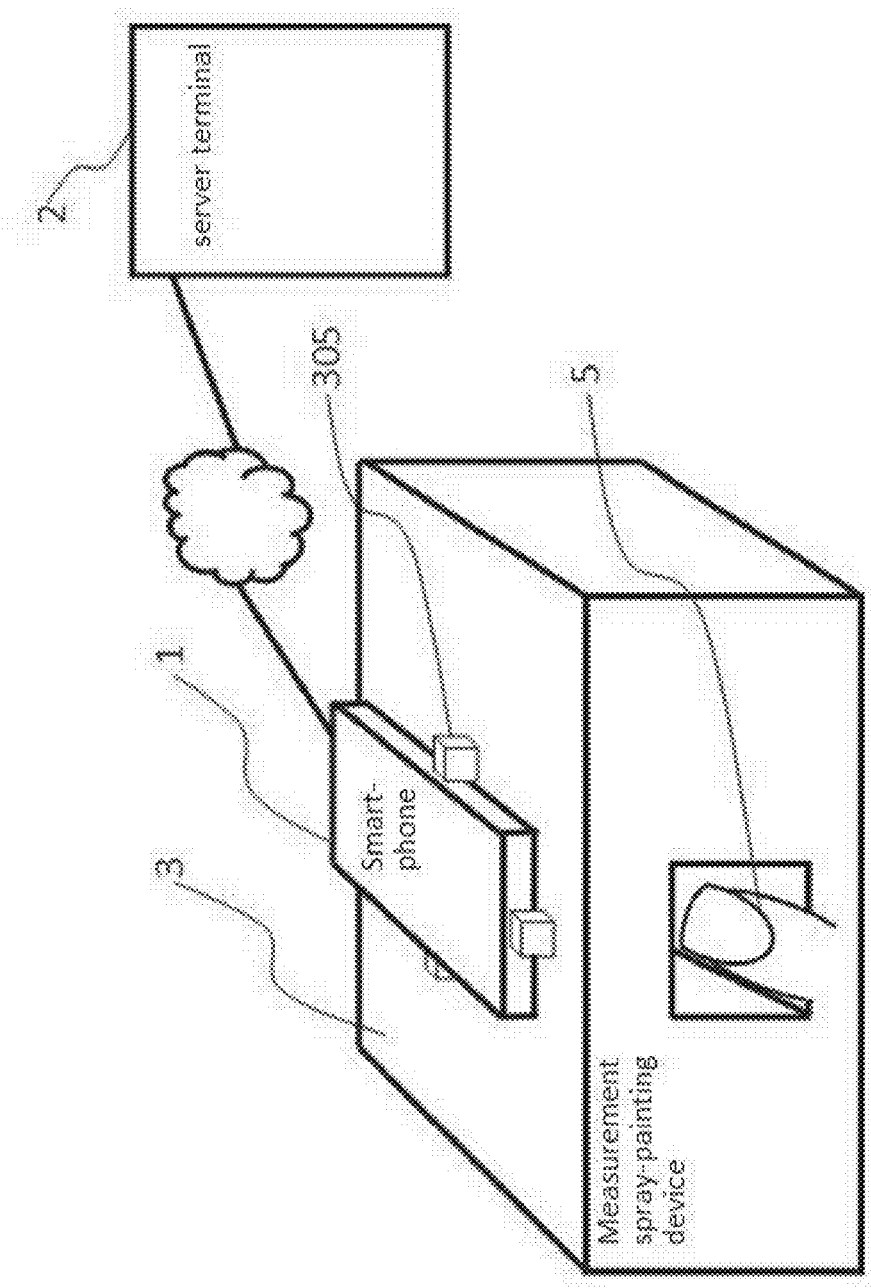
FIG. 2 shows a structure diagram of a manicuring device according to the present invention.

In FIG. 2, the smartphone 1 is arranged on the measurement spray-painting device 3 and is fixed by an intelligent terminal device limiting mechanism 305 on top of the measurement spray-painting device 3. An opening is provided on one side of the measurement spray-painting device 3, the user's finger 5 can be put into the opening and be fixed by the finger limiting mechanism therein. Various components of the finger limiting mechanism can be spaced by a large distance so as allow a finger to be put into the opening. When the finger puts in, respective components of the limiting mechanism draw close to the finger and clamp the finger so that the finger cannot change its position. The smartphone 1 establishes a data connection with the measurement spray-painting device 3 through a USB interface data cable. Further, the smartphone 1 establishes a data connection with the remote server terminal 2 via a wireless communication network. An optical window is provided on top of the measurement spray-painting device 3, and light can pass through the optical window and enter the camera of the smartphone 1. A reflecting mirror assembly is arranged in the measurement spray-painting device 3, and can reflect/refract the image of the user's fingernail to the optical window on top of the measurement spray-painting device 3 and further radiate the image into the camera of the smartphone 1. The intelligent terminal device limiting mechanism of the measurement spray-painting device 3 can also be arranged on one side or oblique side of the measurement spray-painting device, at which point the smartphone is arranged on one side or oblique side of the measurement spray-painting device and the optical window is also arranged on this side or oblique side accordingly. During use, the smartphone 1 and the measurement spray-painting device 3 are connected via a data connection cable, and the manicuring APP module in the smartphone 1 is initiated to log onto the server terminal 2 on the Internet. The user browses the fingernail design repository from the server terminal in the manicuring application of the smartphone and then selects one or more designs. This step may also occur after the step of measuring the fingernail's three-dimensional shape. The smartphone 1 is placed in the intelligent terminal device limiting mechanism 305 of the measurement spray-painting device 3, and then the manicuring device gets prepared for a manicure. The user finger 5 stretches into the measurement spray-painting device 3 from the opening on the side of the measurement spray-painting device 3, the image of the fingernail is reflected into the camera of the smartphone 1, and the smartphone 1 takes multi-angle pictures of the fingernail which are transmitted to the server terminal 2 via a network connection. Multi-angle images of the fingernail 5 are projected into the camera 101 through the reflecting mirror assembly 309, so that the camera 101 can obtain multi-direction multi-perspective fingernail images from one picture that is shot at a time. In this way, it is avoided that fingernail pictures have to be shot multiple times from different angles, the speed of obtaining fingernail images is increased, the proportion of the fingernail in various pictures can be ensured consistent with each other, and the accuracy degree of the fingernail three-dimensional shape recognition is improved. The fingernail three-dimensional shape calculating module measures the fingernail's three-dimensional shape and delivers the same to the painting implementation scheme generating module. The fingernail design repository also delivers the fingernail design which has been selected by the user to the painting implementation scheme generating module. The delivery of the fingernail three-dimensional shape and the delivery of the fingernail design are not subjected to any particular order. The painting implementation scheme generating module calculates a spray-painting implementation scheme for the manicuring process in accordance with the fingernail three-dimensional shape and the fingernail design. The spray-painting implementation scheme is delivered to the spray-painting management module in the manicuring application in the smartphone. The spray-painting management module controls the measurement spray-painting device to complete painting the fingernail.

Figure 3:
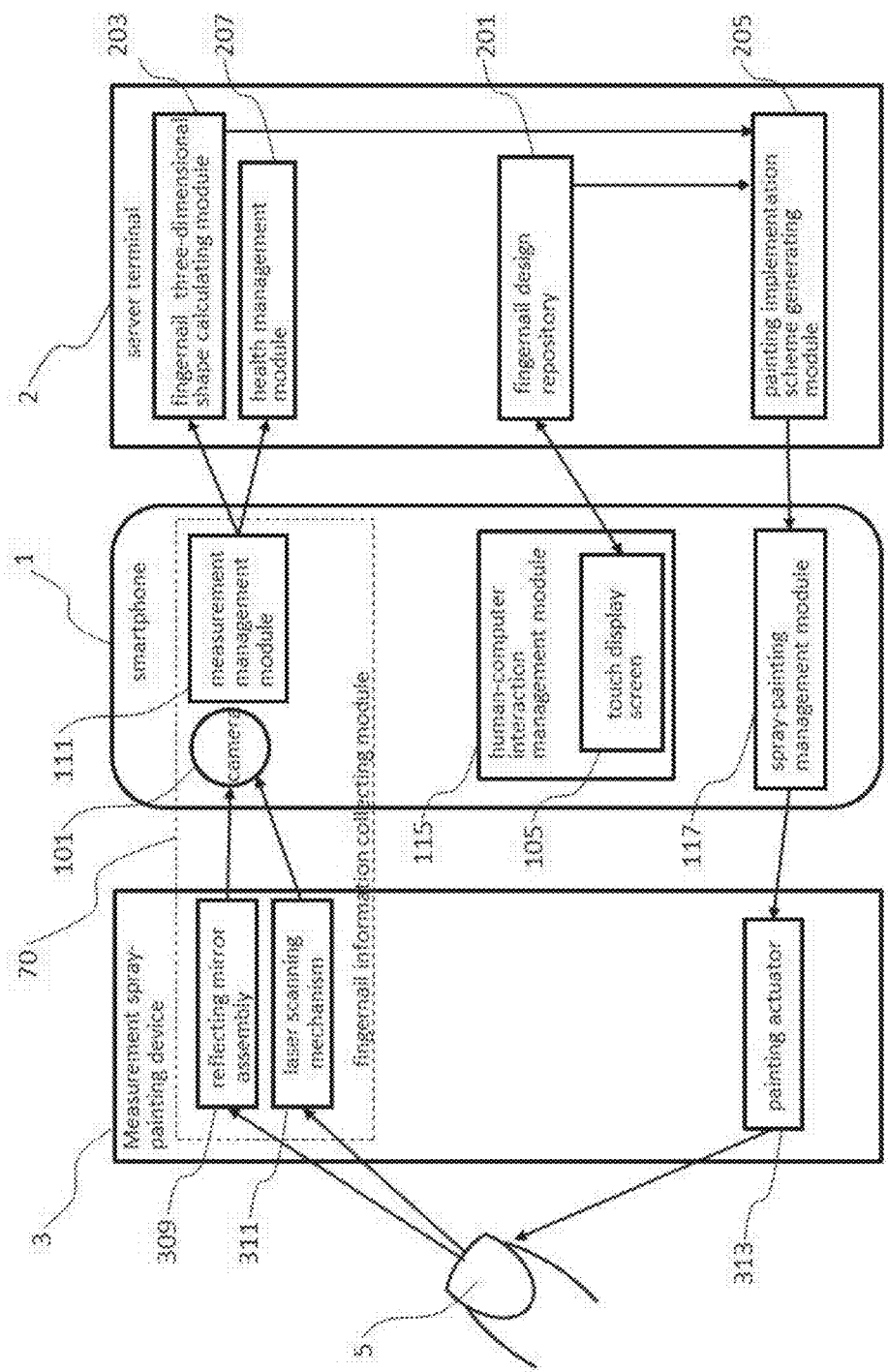
FIG. 3 shows a view of the manicuring process performed by the manicuring device according to the present invention.

In FIG. 3, a fingernail information collecting module 70 comprises the camera 101 of the smartphone 1, the measurement management module 111, the reflecting mirror assembly 309 and the laser scanning mechanism 311 of the measurement spray-painting device 3. The fingernail information collecting module 70 further comprises a visible light and/or infrared lighting device. The fingernail information collecting module 70 further comprises a photographic device arranged in the measurement spray-painting device 3. The reflecting mirror assembly 309 can reflect visible light and infrared images of the fingernail to the camera 101. The measurement management module 111 controls the operation of the camera 101, i.e., controls the camera to take pictures according to instructions of the user and/or the working time sequence of a manicure. The laser scanning mechanism 311 can produce a grid and/or bar and/or point laser spot, and irradiate the user's fingernail to obtain a laser image of the fingernail. The reflecting mirror assembly 309 further comprises a filter with the same wavelength as the laser scanning mechanism 311, the filter allowing the passage of light with the laser wavelength while blocking the passage of light with other wavelengths. After the laser spot irradiates on the user's fingernail, the spot will deform. The camera 101 shoots laser spot images before and after deformation. If the laser scanning mechanism uses a linear and/or point laser light source, multiple pictures of the fingernail when laser irradiates on different positions of the fingernail have to be shot before completing the measurement of the fingernail three-dimensional shape. In this case, the camera 101 needs to work in collaboration with the laser scanning mechanism in a preset time sequence, so as to complete laser scanning measurement of the fingernail. The three-dimensional laser scanning measurement belongs to well known techniques. The measurement management module 111 controls the camera 101 to obtain a visible light picture and/or an infrared picture and/or a laser spot picture, and the obtained image is uploaded to the fingernail three-dimensional shape calculating module 203 and the health management module 207 at the server terminal 2. The fingernail three-dimensional shape calculating module 203 can respectively calculate the fingernail's three-dimensional shape and the fingernail's position in the measurement spray-painting device 3 according to the picture of the fingernail, and deliver the fingernail's three-dimensional shape information and position information to the painting implementation scheme generating module 205. Recognizing the three-dimensional shape and position of a fingernail according to the fingernail's multi-angle pictures and/or laser scanned image is a well known technique. The health management module 207 can identify the user's health condition according to a preset expert diagnosis system based on the fingernail's visible light and infrared pictures, deliver the user's health information to the smartphone, and further feed back the health information to the user in the form of sound and image via the smartphone. The health management module 207 delivers the user's health information to the user management module for big data analysis of user health and demands. Identifying the health condition according to fingernails is also a well known technique. After the user initiates the manicuring device of the present invention, the user logs onto the user management module in the server terminal 2 via the manicuring APP in the smartphone 1. The fingernail information collecting module 70 completes collecting information of the user's fingernail 5 and uploads the same to the server terminal 2. The fingernail design repository 201 at the server terminal delivers a plurality of fingernail designs to the human-computer interaction management module 115 of the user's smartphone, and the user browses to select a fingernail design through human-computer interaction via a touch display screen 105. The fingernail design repository 201 delivers the design selected by the user to the painting implementation scheme generating module 205 which then calculates a spray-painting implementation scheme for the fingernail according to the fingernail three-dimensional shape and fingernail design. The spray-painting implementation scheme is delivered to the spray-painting management module 117 in the smartphone 1. According to the spray-painting implementation scheme, the spray-painting management module 117 controls the painting actuator 313 in the measurement spray-painting device 3 to complete spray-painting the fingernail design. The process is repeated until all fingernails of the user have been spray-painted. The spray-painting implementation scheme comprises control information such as dye selection, posture control, and position control of the nozzle and/or paintbrush in the painting actuator. The spray-painting management module can be arranged at the server terminal or in the measurement spray-painting device. The fingernail three-dimensional shape calculating module, the health management module, the fingernail design repository as well as the painting implementation scheme generating module can be arranged in the intelligent terminal device.

Figure 4:
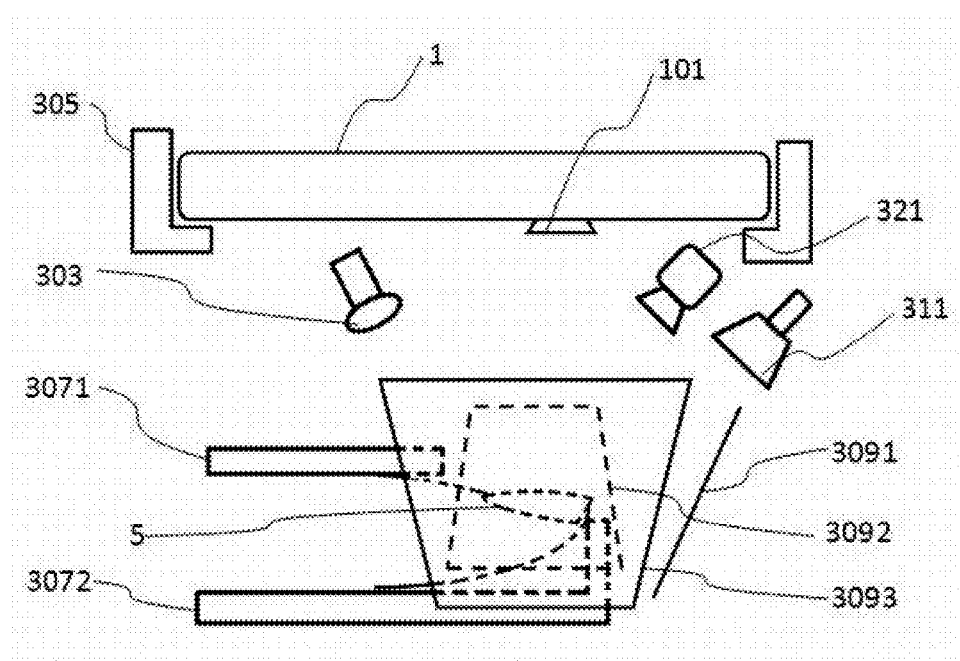
FIG. 4 shows a lateral view of the structure of a manicuring device according to an embodiment of the present invention.

In FIG. 4, during a manicure, the smartphone 1 is placed on the intelligent terminal device limiting mechanism 305 of the measurement spray-painting device, and the camera 101 of the smartphone 1 is aligned with the reflecting mirror assembly. The reflecting mirror assembly comprises a reflecting mirror 3091, a reflecting mirror 3092 and a reflecting mirror 3093. The reflecting mirrors 3091 to 3093 are respectively arranged on the left, right and front side of the fingernail 5 and reflect images of the fingernail into the camera 101. The camera 101 can simultaneously shoot the reflecting mirrors 3091 to 3093 and the fingernail 5. As such, the camera 101 can simultaneously take images of the fingernail from different perspectives as top, left, right and front sides, i.e., images of the fingernail from four angles are included in one picture shot by the camera 101. In this way, the camera 101 can obtain multi-direction multi-perspective images of the fingernail from one picture that is shot at a time. Further, it is avoided that fingernail pictures have to be shot multiple times from different angles, the speed of obtaining fingernail images is increased, the proportion of the fingernail in various pictures can be ensured consistent with each other, and the accuracy degree of the fingernail three-dimensional shape recognition is improved. The measurement spray-painting device further comprises at least one infrared light source 303 for providing infrared illumination for the fingernail 5 so that the camera can shoot infrared images of the fingernail. The measurement spray-painting device further comprises at least one image collecting device 321, which is independent of the camera 101 and can shoot pictures of fingernails. Pictures shot by the image collecting device 321 are transmitted to the smartphone via a data cable and further to the server terminal via the smartphone. The image collecting device 321 may serve as a supplement as the camera 101. The measurement spray-painting device further comprises at least one laser scanning mechanism 311. The measurement spray-painting device further comprises at least one finger limiting mechanism. A finger limiting mechanism 3071 presses the finger above and a finger limiting mechanism 3072 clamps the finger below, such that the finger is prevented from changing its position at random.

Figure 5:
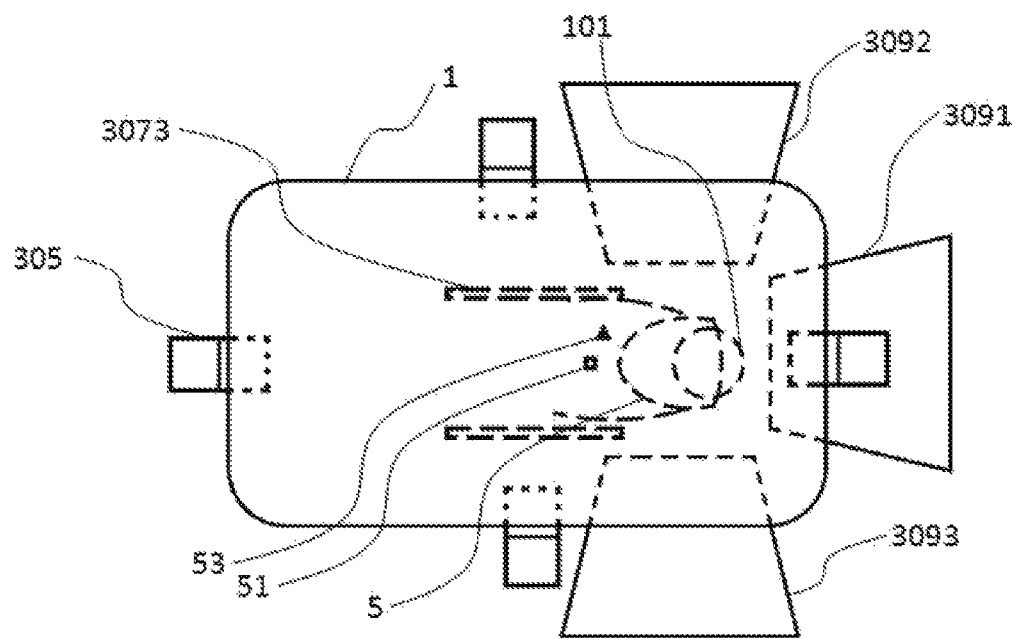
FIG. 5 shows a top view of the structure of a manicuring device according to an embodiment of the present invention.

In FIG. 5, a finger limiting mechanism 3073 clamps the finger from the left side and right side, such that the finger is prevented from changing its position at random. The reflecting mirror 3091 is arranged in front of the fingernail 5 and reflects images of the fingernail 5 into the camera 101; the reflecting mirror 3092 is arranged on the left of the fingernail 5 and reflects images of the fingernail 5 into the camera 101; the reflecting mirror 3093 is arranged on the right of the fingernail 5 and reflects images of the fingernail 5 into the camera 101. The camera 101 is arranged above the fingernail 5. In this way, the camera 101 can simultaneously take pictures of the upper, left, right and front sides of the fingernail. The smartphone 1 is fixed by the intelligent terminal device limiting mechanism 305. In order to conveniently locate the fingernail position and identify in time whether the fingernail position changes in the fingernail painting process, at least two locating points are placed in non-fingernail positions on the finger's distal joint close to the fingernail. A locating point 53 is a triangular reflective thin plate affixed to the skin behind the fingernail, and a locating point 51 is a square dye point painted on the skin around the fingernail. The locating point may further take other shape. The shape and/or arrangement of the locating point functions to indicate a direction and can be used for locating the finger and the fingernail's position. The locating points 51 and 53 can be shot by the camera 101. The measurement management module can identify positions of the locating points 51 and 53 in real time. During recognizing a three-dimensional shape of the fingernail, the measurement management module records positions of the locating points 51 and 53. In the fingernail painting process, the measurement management module identifies positions of the locating points 51 and 53 in real time; if the positions do not change, then the painting process continues; if the positions of the locating points 51 and 53 change, the measurement management module identifies displacement variations of the locating points and delivers the variation information to the painting implementation scheme generating module in real time. According to the real-time displacement variation of the fingernail, the painting implementation scheme generating module re-calculates a painting implementation scheme and delivers the new painting implementation scheme to the spray-painting management module. The measurement management module also can deliver the displacement variation of the fingernail to the spray-painting management module which adjusts a spray-painting implementation scheme in real time according to the fingernail's latest position and ensures a design to be spray-painted on the correct position of the fingernail. The identifying positions of the locating points may also be completed by the fingernail three-dimensional shape calculating module at the server terminal.

Figure 6:
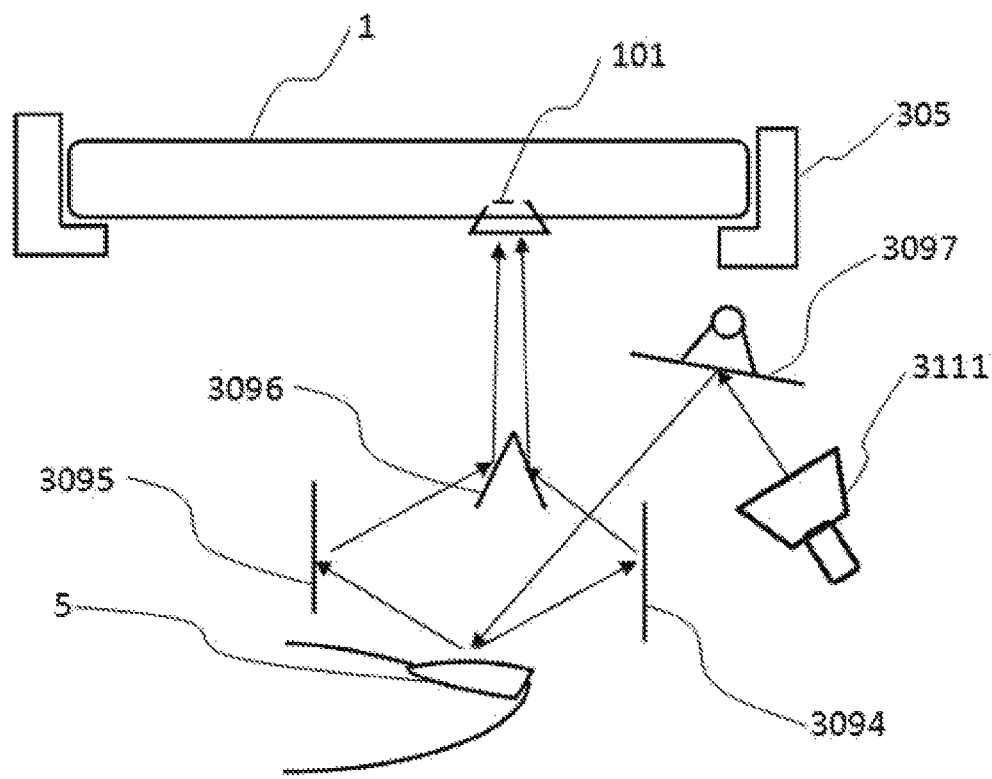
FIG. 6 shows a schematic view of a laser scanning mechanism of a manicuring device according to an embodiment of the present invention.

In FIG. 6, the fingernail information collecting module further comprises a three-dimensional laser measurement system. The three-dimensional laser measurement system comprises a laser scanning mechanism, a reflecting mirror assembly, a camera and a measurement management module. The laser scanning mechanism comprises a laser light source 3111 which can produce a grid and/or linear spot. A laser emitted from the laser light source 3111 irradiates on a scanning mirror assembly 3097 via which the laser is reflected to the fingernail 5. A spot image on the fingernail 5 is reflected to a reflecting mirror assembly 3096 through a reflecting mirror 3094 and a reflecting mirror 3095 and further enters the camera 101 of the smartphone 1. The reflective mirror surface of the scanning mirror assembly 3097 can rotate about a fixed shaft, such that the swing of the reflective mirror surface will change the refraction angle of the laser and further the position of the laser spot on the fingernail 5 changes. Laser spot images of different positions of the fingernail can be obtained by synchronizing the swing angle of the reflective mirror surface with the shooting time of the camera 101. The reflecting mirror 3094 and the reflecting mirror 3095 are arranged in front of and behind the fingernail or on the left and right of the fingernail, i.e., the reflecting mirrors 3094 and 3095 are distributed on two different sides of a spot on the fingernail, so that images from different perspectives on the left and right of the spot can be obtained. The reflecting mirror assembly 3096 comprises at least two reflective mirror surfaces, one of which faces the reflecting mirror 3095 and the other of which faces the reflecting mirror 3094. From the perspective of the camera 101, all reflective mirror surfaces of the reflecting mirror assembly 3096 can be shot by the camera 101. The reflecting mirror assembly 3096 accepts light reflected from the reflecting mirrors 3094 and 3095 and reflects the same to the camera 101, such that the camera 101 records images from two different angles of the spot on the fingernail in one picture. With the rotation of the scanning mirror assembly 3097, the laser spot moves on the fingernail and the camera 101 can shoot fingernail spot images in different positions. The measurement management module uploads spot pictures in different fingernail positions to the fingernail three-dimensional shape calculating module on the server terminal which then completes precise measurement of the fingernail three-dimensional shape. The method for three-dimensional laser measurement belongs to well known techniques. A known three-dimensional laser measurement device requires at least two cameras that are arranged on the left and right of a spot with a certain angle therebetween. The two cameras simultaneously shoot two pictures from the left and right perspectives of the same spot, and three-dimensional coordinates on the surface of the spot are calculated by triangulation based on the two pictures. In the present invention, the reflecting mirror assembly comprises at least two reflecting mirrors that are located in different positions around the fingernail and reflect fingernail images to the camera, and the camera can shoot laser spot images from two different perspective in one picture, which corresponds to that the three-dimensional laser measurement system has at least two cameras. By using the reflecting mirror assembly to simultaneously reflect spot images from different perspectives to the camera, the structure of the laser measurement system is simplified, the cost is reduced, and in the meanwhile the precision of laser measurement is improved.

A manicuring method based on the manicuring device of the present invention comprises the steps of:

a. connecting an intelligent terminal device with a measurement spray-painting device;

b. initiating a manicuring application module in the intelligent terminal device, the manicuring application module establishing a connection with a server terminal;

c. a user browsing manicure designs in a fingernail design repository at the server terminal via a human-computer interaction management module of the manicuring application module and selecting a manicure design;

d. the user putting a finger into the measurement spray-painting device and the manicuring application module controlling a fingernail information collecting module to complete collecting fingernail information;

e. the manicuring application module delivering the collected fingernail information of the user to a fingernail three-dimensional shape calculating module;

f. the fingernail three-dimensional shape calculating module calculating a three-dimensional shape of the user's fingernail and delivering the three-dimensional shape information of the fingernail to a painting implementation scheme generating module;

g. the painting implementation scheme generating module calculating a painting implementation scheme according to the three-dimensional shape of the user's fingernail and the manicure design selected by the user, and delivering the painting implementation scheme to a spray-painting management module in the manicuring application module in the intelligent terminal device; and h. the spray-painting management module controlling the measurement spray-painting device to complete painting the fingernail design, wherein the step a may be executed after the step b or c; and wherein the order between the step c and the steps d, e, f can interchange.

A manicuring method based on the manicuring device of the present invention comprises the steps of:

a. arranging at least two locating points on the skin around a fingernail;

b. measuring position changes of the locating points in real time during spray-painting so as to estimate whether a position of the fingernail changes or not; and c. if the position of the fingernail changes, adjusting a spray-painting implementation scheme.

In the step a, the locating point can be a locating plate affixed to the skin behind the fingernail or dye point spray-painted on the skin around the fingernail. In case of an adhesive locating plate, then the locating plate may be affixed to the skin before the user puts the finger into the measurement spray-painting device. In case of a spray-painted dye point, then the locating point may be spray-painted on the skin behind the fingernail before starting to measure the three-dimensional shape of the fingernail. As such, the locating point is also shot while shooting images of the fingernail. After images are transmitted to the fingernail three-dimensional shape calculating module, this module can identify these locating points and calculate a positional relationship between the locating points and the fingernail. Since the skin behind the fingernail and the position of the fingernail are fixed, the positional relationship between the fingernail and the locating points is also fixed. The skin behind the fingernail is the skin where a finger joint to which the fingernail belongs is close to the fingernail. If the position of the locating point changes, then the position of the fingernail also changes, and the position change of the fingernail can be calculated according to the position change of the locating point. In this way, the position of the fingernail can be determined according to the locating point. Since identifying the locating point is much easier than identifying the fingernail, the efficiency of identifying the position change of the fingernail in real time can be improved, and the precision degree of painting implementation increased.

A health management method based on the manicuring device of the present invention comprises the steps of:
   a. connecting an intelligent terminal device with a measurement spray-painting device;
   b. initiating a manicuring application module in the intelligent terminal device, the manicuring application module establishing a connection with a server terminal;
   c. a user putting a finger into the measurement spray-painting device and the manicuring application module controlling a fingernail information collecting module to complete collecting fingernail information;
   d. the manicuring application module delivering the collected fingernail and image information of the user to a fingernail three-dimensional shape calculating module and/or a health management module;
   e. the fingernail three-dimensional shape calculating module calculating a three-dimensional shape of the user's fingernail and delivering the three-dimensional shape information of the fingernail to the health management module;
   f. the health management module estimating the health condition of the user according to the image information and/or the three-dimensional shape information of the user's fingernail; and
   g. the health management module pushing the health condition of the user to the intelligent terminal device and presenting the same to the user,
   wherein the order between the steps a and b can interchange; and wherein the step e can be removed.

An information pushing method based on the manicuring device of the present invention comprises the steps of:
   a. initiating a manicuring application module in an intelligent terminal device, the manicuring application module establishing a connection with a server terminal;
   b. a user logging onto a user management module at the server terminal;
   c. the user management module performing big data analysis on the user according to information such as the user's personal characteristics and/or health condition and/or behavior of using the manicuring application and/or response to pushed information, so as to estimate the user's personal preference and/or consumer demand of the user; and
   d. an information pushing module pushing promotion information concerning the user's personal preference and/or consumer demand to the manicuring application of the intelligent terminal device according to the user's personal preference and/or consumer demand,
   wherein the step b can be removed; and wherein the step c can be removed.

The invention claimed is:

1. A manicuring method based on a manicuring device, wherein the manicuring device comprises at least one server terminal,
   wherein:
   the server terminal comprises at least one fingernail design repository,
   the fingernail design repository comprises at least one free repository, at least one charging repository, and at least one user uploaded repository,
   the at least one free repository, the at least one charging repository and the at least one user uploaded repository can deliver data among them,
   at least one intelligent terminal device is comprised, at least one measurement spray-painting device is comprised,
   the intelligent terminal device is connected with the measurement spray-painting device,
   the intelligent terminal device comprises at least one manicuring application module comprising at least one spray-painting management module,
   the measurement spray-painting device comprises a painting mechanism capable of painting dye on the surface of fingernail,
   the server and/or the intelligent terminal device comprises fingernail three-dimensional shape calculating module capable of measuring a three-dimensional shape of the fingernail, and
   the spray-painting management module is able to control the painting mechanism to complete spray-painting a manicure design on the fingernail,
   the manicuring method comprising the steps of:
   a. arranging at least two locating points on the skin around the fingernail and/or on the fingernail;
   b. measuring position changes of the locating points in real time during spray-painting so as to judge whether a position of the fingernail changes or not; and
   c. if the position of the fingernail changes, adjusting a spray-painting implementation scheme.

2. A manicuring device, comprising at least one server terminal, wherein:
   at least one intelligent terminal device is comprised, at least one measurement spray-painting device is comprised;
   the intelligent terminal device is connected with the measurement spray-painting device;
   the intelligent terminal device comprises at least one manicuring application module, comprising at least one spray-painting management module;
   the measurement spray-painting device comprises a painting mechanism capable of painting dye on the surface of fingernail;
   the measurement spray-painting device comprises at least one reflecting mirror assembly comprising at least one reflecting mirror and/or prism, the at least one reflecting mirror and or prism is arranged in different positions around the fingernail, with an angle of intersection between different reflecting mirrors, and can reflect images of the fingernail from multiple different angles and piece together these images of the fingernail into one picture that is further reflected to a camera, so that the camera can record multi-angle images of the fingernail in one picture;
   the server and/or the intelligent terminal device comprises fingernail three-dimensional shape calculating module capable of measuring a three-dimensional shape of the fingernail;
   the spray-painting management module is able to control the painting mechanism to complete spray-painting a manicure design on the fingernail.

3. A manicuring method based on a manicuring device of claim 2, comprising:
   a. connecting an intelligent terminal device with a measurement spray-painting device;
   b. initiating a manicuring application module in the intelligent terminal device, the manicuring application module establishing a connection with a server terminal;
   c. a user browsing manicure designs in a fingernail design repository at the server terminal via a human-computer interaction management module of the manicuring application module and selecting a manicure design;
   d. the user putting a finger into the measurement spray-painting device and the manicuring application module controlling a fingernail information collecting module to complete collecting fingernail information;

e. the manicuring application module delivering the collected fingernail information of the user to a fingernail three-dimensional shape calculating module;
f. the fingernail three-dimensional shape calculating module calculating a three-dimensional shape of the user fingernail and delivering the three-dimensional shape information to a painting implementation scheme generating module;
g. the painting implementation scheme generating module calculating a painting implementation scheme according to the three-dimensional shape of the user fingernail and the manicure design selected by the user, and delivering the painting implementation scheme to a spray-painting management module in the manicuring application module in the intelligent terminal device; and
h. the spray-painting management module controlling the measurement spray-painting device to complete painting the fingernail design,
wherein the step a may be executed after the step b or c; and wherein the order between the step c and the steps d, e, f can interchange.

4. A manicuring method based on a manicuring device of claim 2, comprising:
a. arranging at least two locating points on the skin around the fingernail and/or on the fingernail;
b. measuring position changes of the locating points in real time during spray-painting so as to judge whether a position of the fingernail changes or not; and
c. if the position of the fingernail changes, adjusting a spray-painting implementation scheme.

5. The manicuring device according to claim 2, comprising at least one server terminal connected with an intelligent terminal device on which a manicuring application is installed, the server terminal comprising:
at least one health management module, the health management module can receive the three-dimensional shape information of the user fingernail delivered by the fingernail three-dimensional shape calculating module, the health management module can estimate health condition of the user according to the three-dimensional shape information of the user fingernail.

6. The manicuring device according to claim 2, comprising at least server terminal connected with an intelligent terminal device on which a manicuring application is installed, the server terminal comprising:
at least one user management module, the user management module performing big data analysis of a user according to the user's personal features and/or health condition and/or features of using the manicuring application and/or response to pushed information, so as to estimate the user's personal preference and/or consumer demand;
the user management module comprising at least one information pushing module capable of pushing promotion information regarding the user's personal preference and/or consumer demand to the manicuring application of the intelligent terminal device according to the user's personal preference and/or consumer demand.

7. A manicuring method based on a manicuring device, wherein the manicuring device comprises at least one server terminal,
wherein:
at least one intelligent terminal device is comprised, at least one measurement spray-painting device is comprised,
the intelligent terminal device is connected with the measurement spray-painting device,
the intelligent terminal device comprises at least one manicuring application module comprising at least one spray-painting management module,
the measurement spray-painting device comprises a painting mechanism capable of painting dye on the surface of fingernail,
the server and/or the intelligent terminal device comprises fingernail three-dimensional shape calculating module capable of measuring a three-dimensional shape of the fingernail,
the intelligent terminal device can upload images of the fingernail and/or laser spot images to the server terminal,
the server terminal comprises at least one painting implementation scheme generating module which can calculate a painting implementation scheme according to a design selected by the user and the fingernail's three-dimensional shape,
the intelligent terminal device can download painting implementation schemes from the server terminal, and
the spray-painting management module is able to control the painting mechanism to complete spray-painting a manicure design on the fingernail,
the manicuring method comprising the steps of:
a. arranging at least two locating points on the skin around the fingernail and/or on the fingernail;
b. measuring position changes of the locating points in real time during spray-painting so as to judge whether a position of the fingernail changes or not; and
c. if the position of the fingernail changes, adjusting a spray-painting implementation scheme.

8. A manicuring method based on a manicuring device, wherein the manicuring device comprises at least one server terminal,
wherein:
at least one intelligent terminal device is comprised, at least one measurement spray-painting device is comprised,
the intelligent terminal device is connected with the measurement spray-painting device,
the measurement spray-painting device comprises at least one intelligent terminal device limiting mechanism on which the intelligent terminal device can be placed,
an optical window is provided on the measurement spray-painting device, and light can pass through the optical window and enter the camera of the intelligent terminal device,
the intelligent terminal device comprises at least one manicuring application module comprising at least one spray-painting management module,
the measurement spray-painting device comprises a painting mechanism capable of painting dye on the surface of fingernail,
the server and/or the intelligent terminal device comprises fingernail three-dimensional shape calculating module capable of measuring a three-dimensional shape of the fingernail, and
the spray-painting management module is able to control the painting mechanism to complete spray-painting a manicure design on the fingernail,
the manicuring method comprising the steps of:
a. arranging at least two locating points on the skin around the fingernail and/or on the fingernail;

b. measuring position changes of the locating points in real time during spray-painting so as to judge whether a position of the fingernail changes or not; and c. if the position of the fingernail changes, adjusting a spray-painting implementation scheme.

9. A manicuring device, comprising at least one server terminal, wherein:

at least one intelligent terminal device is comprised, at least one measurement spray-painting device is comprised;

the intelligent terminal device is connected with the measurement spray-painting device;

the intelligent terminal device comprises at least one manicuring application module comprising at least one spray-painting management module;

the measurement spray-painting device comprises a painting mechanism capable of painting dye on the surface of fingernail;

the server and/or the intelligent terminal device comprises fingernail three-dimensional shape calculating module capable of measuring a three-dimensional shape of the fingernail;

the spray-painting management module is able to control the painting mechanism to complete spray-painting a manicure design on the fingernail;

the measurement management module can identify the position change of the locating point in real time and further identify the position change of the fingernail in real time, the measurement management module can deliver information on the position change of the fingernail to the spray-painting management module which can adjust a spray-painting implementation scheme in real time according to the fingernail's latest position and ensure the design to be spray-painted on a correct position of the fingernail.

10. A manicuring method based on a manicuring device of claim 9, comprising:

a. connecting an intelligent terminal device with a measurement spray-painting device;

b. initiating a manicuring application module in the intelligent terminal device, the manicuring application module establishing a connection with a server terminal;

c. a user browsing manicure designs in a fingernail design repository at the server terminal via a human-computer interaction management module of the manicuring application module and selecting a manicure design;

d. the user putting a finger into the measurement spray-painting device and the manicuring application module controlling a fingernail information collecting module to complete collecting fingernail information;

e. the manicuring application module delivering the collected fingernail information of the user to a fingernail three-dimensional shape calculating module;

f. the fingernail three-dimensional shape calculating module calculating a three-dimensional shape of the user fingernail and delivering the three-dimensional shape information to a painting implementation scheme generating module;

g. the painting implementation scheme generating module calculating a painting implementation scheme according to the three-dimensional shape of the user fingernail and the manicure design selected by the user, and delivering the painting implementation scheme to a spray-painting management module in the manicuring application module in the intelligent terminal device; and h. the spray-painting management module controlling the measurement spray-painting device to complete painting the fingernail design, wherein the step a may be executed after the step b or c; and wherein the order between the step c and the steps d, e, f can interchange.

11. The manicuring device according to claim 9, comprising at least one server terminal connected with an intelligent terminal device on which a manicuring application is installed, the server terminal comprising:

at least one health management module, the health management module can receive the three-dimensional shape information of the user fingernail delivered by the fingernail three-dimensional shape calculating module, the health management module can estimate health condition of the user according to the three-dimensional shape information of the user fingernail.

12. The manicuring device according to claim 9, comprising at least server terminal connected with an intelligent terminal device on which a manicuring application is installed, the server terminal comprising:

at least one user management module, the user management module performing big data analysis of a user according to the user's personal features and/or health condition and/or features of using the manicuring application and/or response to pushed information, so as to estimate the user's personal preference and/or consumer demand;

the user management module comprising at least one information pushing module capable of pushing promotion information regarding the user's personal preference and/or consumer demand to the manicuring application of the intelligent terminal device according to the user's personal preference and/or consumer demand.

13. A manicuring method based on a manicuring device of claim 9, comprising:

a. arranging at least two locating points on the skin around the fingernail and/or on the fingernail;

b. measuring position changes of the locating points in real time during spray-painting so as to judge whether a position of the fingernail changes or not; and c. if the position of the fingernail changes, adjusting a spray-painting implementation scheme.

14. A manicuring device, comprising at least one server terminal, wherein:

at least one intelligent terminal device is comprised, at least one measurement spray-painting device is comprised;

the intelligent terminal device is connected with the measurement spray-painting device;

the intelligent terminal device comprises at least one manicuring application module comprising at least one spray-painting management module;

the measurement spray-painting device comprises a painting mechanism capable of painting dye on the surface of fingernail;

the server and/or the intelligent terminal device comprises fingernail three-dimensional shape calculating module capable of measuring a three-dimensional shape of the fingernail;

the spray-painting management module is able to control the painting mechanism to complete spray-painting a manicure design on the fingernail.

the fingernail information collecting module can collect in real time the enforcement condition of the fingernail design being painted, the fingernail three-dimensional shape calculating module can identify in real time the enforcement condition of the design, and estimate whether the fingernail is displaced according to two consecutive painting designs of the fingernail, if the fingernail is displaced, the painting implementation scheme generating module can adjust in real time the spray-painting implementation scheme according to the position change of the fingernail and the enforcement condition of the design.

15. The manicuring device according to claim 14, comprising at least one server terminal connected with an intelligent terminal device on which a manicuring application is installed, the server terminal comprising:
at least one health management module, the health management module can receive the three-dimensional shape information of the user fingernail delivered by the fingernail three-dimensional shape calculating module, the health management module can estimate health condition of the user according to the three-dimensional shape information of the user fingernail.

16. The manicuring device according to claim 14, comprising at least server terminal connected with an intelligent terminal device on which a manicuring application is installed, the server terminal comprising:
at least one user management module, the user management module performing big data analysis of a user according to the user's personal features and/or health condition and/or features of using the manicuring application and/or response to pushed information, so as to estimate the user's personal preference and/or consumer demand;
the user management module comprising at least one information pushing module capable of pushing promotion information regarding the user's personal preference and/or consumer demand to the manicuring application of the intelligent terminal device according to the user's personal preference and/or consumer demand.

17. A manicuring method based on a manicuring device of claim 14, comprising:
a. arranging at least two locating points on the skin around the fingernail and/or on the fingernail;
b. measuring position changes of the locating points in real time during spray-painting so as to judge whether a position of the fingernail changes or not; and
c. if the position of the fingernail changes, adjusting a spray-painting implementation scheme.

18. A manicuring method based on a three-dimensional shape of a fingernail, characterized by comprising the steps of:
S1. obtaining three-dimensional shape information of the fingernail;
S2. determining at least one manicure design information;
S3. generating spray-painting control information based on the three-dimensional shape information of the fingernail and said manicure design information;
S4. controlling a spray-painting device to perform the spray-painting operation of the manicure design based on the spray-painting control information, the fingernail information collecting module collecting in real time the enforcement condition of the fingernail design being painted, the fingernail three-dimensional shape calculating module identifying in real time the enforcement condition of the design, and estimating whether the fingernail is displaced according to two consecutive painting designs of the fingernail, if the fingernail is displaced, the painting implementation scheme generating module adjusting in real time the spray-painting implementation scheme according to the position change of the fingernail and the enforcement condition of the design.

* * * * *